(12) United States Patent
Aspar et al.

(10) Patent No.: US 7,498,245 B2
(45) Date of Patent: Mar. 3, 2009

(54) EMBRITTLED SUBSTRATE AND METHOD FOR MAKING SAME

(75) Inventors: Bernard Aspar, Rives (FR); Chrystelle Lagahe, St-Laurent-du-Pont (FR); Olivier Rayssac, Grenoble (FR); Bruno Ghyselen, Seyssinet (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 10/276,306

(22) PCT Filed: May 29, 2001

(86) PCT No.: PCT/FR01/01659

§ 371 (c)(1),
(2), (4) Date: Nov. 22, 2002

(87) PCT Pub. No.: WO01/93325

PCT Pub. Date: Dec. 6, 2001

(65) Prior Publication Data

US 2003/0077885 A1      Apr. 24, 2003

(30) Foreign Application Priority Data

May 30, 2000   (FR)  .................................. 00 06909

(51) Int. Cl.
*H01L 21/00*       (2006.01)
(52) U.S. Cl. ........................ 438/514; 438/459; 438/460
(58) Field of Classification Search ................. 438/514, 438/459, 460
See application file for complete search history.

(56) References Cited

U.S. PATENT DOCUMENTS

| | | | | |
|---|---|---|---|---|
| 4,179,324 A | * | 12/1979 | Kirkpatrick | 156/230 |
| 4,704,302 A | * | 11/1987 | Bruel et al. | 438/585 |
| 4,931,405 A | * | 6/1990 | Kamijo et al. | 438/143 |
| 5,034,343 A | * | 7/1991 | Rouse et al. | 438/400 |
| 5,110,748 A | * | 5/1992 | Sarma | 438/30 |
| 5,198,371 A | * | 3/1993 | Li | 438/475 |
| 5,234,535 A | * | 8/1993 | Beyer et al. | 438/459 |
| 5,250,446 A | * | 10/1993 | Osawa et al. | 438/798 |

(Continued)

FOREIGN PATENT DOCUMENTS

FR     2 748 851     11/1997

(Continued)

OTHER PUBLICATIONS

T.Som et al "Diffusion Study of Plasma Ion Implanted H in Silicon", Nuclear Instruments & Methods in Physics Research, Section B Beam Interactions With Materials and Atoms, vol. 161-163, pp. 677-681 Mar. 2000.*

(Continued)

*Primary Examiner*—Laura M Menz
(74) *Attorney, Agent, or Firm*—Oblon, Spivak, McClelland, Maier & Neustadt, P.C.

(57) ABSTRACT

This invention relates to a substrate (1) weakened by the presence of a micro-cavities zone, the micro-cavities zone (4') delimiting a thin layer (5) with one face (2) of the substrate (1), some or all of the gaseous species having been eliminated from the micro-cavities (4').

The invention also relates to a process for the production of such a substrate.

29 Claims, 4 Drawing Sheets

U.S. PATENT DOCUMENTS

| | | | | |
|---|---|---|---|---|
| 5,256,581 | A * | 10/1993 | Foerstner et al. | 438/459 |
| 5,310,446 | A * | 5/1994 | Konishi et al. | 117/58 |
| 5,374,564 | A * | 12/1994 | Bruel | 438/455 |
| 5,413,951 | A * | 5/1995 | Ohori et al. | 438/479 |
| 5,494,835 | A * | 2/1996 | Bruel | 156/250 |
| 5,524,339 | A * | 6/1996 | Gorowitz et al. | 29/841 |
| 5,559,043 | A * | 9/1996 | Bruel | 438/407 |
| 5,567,654 | A * | 10/1996 | Beilstein et al. | 438/4 |
| 5,618,739 | A * | 4/1997 | Takahashi et al. | 438/158 |
| 5,622,896 | A * | 4/1997 | Knotter et al. | 438/123 |
| 5,633,174 | A * | 5/1997 | Li | 438/475 |
| 5,661,333 | A * | 8/1997 | Bruel et al. | 257/618 |
| 5,804,086 | A * | 9/1998 | Bruel | 216/33 |
| 5,817,368 | A * | 10/1998 | Hashimoto | 427/255.38 |
| 5,863,830 | A * | 1/1999 | Bruel et al. | 438/478 |
| 5,877,070 | A | 3/1999 | Tong et al. | |
| 5,897,331 | A * | 4/1999 | Sopori | 438/90 |
| 6,020,252 | A * | 2/2000 | Aspar et al. | 438/458 |
| 6,225,192 | B1 | 5/2001 | Aspar et al. | 438/460 |
| 6,271,101 | B1 | 8/2001 | Fukunaga | 438/455 |
| 6,303,472 | B1 * | 10/2001 | Queirolo et al. | 438/482 |
| 6,335,258 | B1 * | 1/2002 | Aspar et al. | 438/406 |
| 6,342,433 | B1 * | 1/2002 | Ohmi et al. | 438/455 |
| 6,362,077 | B1 * | 3/2002 | Aspar et al. | 438/458 |
| 6,458,672 | B1 * | 10/2002 | Henley et al. | 438/478 |
| 6,465,327 | B1 * | 10/2002 | Aspar et al. | 438/458 |
| 6,486,041 | B2 * | 11/2002 | Henley et al. | 438/458 |
| 6,500,732 | B1 * | 12/2002 | Henley et al. | 438/459 |
| 6,528,391 | B1 * | 3/2003 | Henley et al. | 438/459 |
| 6,544,862 | B1 * | 4/2003 | Bryan | 438/455 |

FOREIGN PATENT DOCUMENTS

| | | |
|---|---|---|
| FR | 2 773 261 | 7/1999 |
| FR | 2 774 511 | 8/1999 |
| WO | 00 19499 | 4/2000 |

OTHER PUBLICATIONS

Tong et al.: "A smarter-cut to low temperature silicon transfer layer" Applied Physics Letters, vol. 72, No. 1, pp. 49-51, Jan. 5, 1998.

T. Som et al.: "Diffusion study of plasma ion implanted H in silicon" Nuclear Instruments & Methods in Physics Research, Section-B: Beam Interactions With Materials and Atoms, vol. 161-163, pp. 677-681 Mar. 2000.

Madras, Giridhar and McCoy, Benjamin J. (2001) "Distribution Kinetics Theory of Ostwald Ripening," Journal of Chemical Physics 115(14) pp. 6699-6706.

* cited by examiner

EMBRITTLED SUBSTRATE AND METHOD FOR MAKING SAME

DESCRIPTION

1. Technical Field

This invention relates to a substrate weakened by the presence of a micro-cavities zone.

It also relates to a manufacturing process for a weakened substrate. It also relates to a process for obtaining a thin layer. It also relates to a process for obtaining a semiconductor on insulator type structure.

The invention is particularly applicable to microelectronics and to the semiconductors field.

2. State of Prior Art

Gaseous species can advantageously be introduced into a solid material by ionic implantation. Thus, document FR-A-2 681 472 (corresponding to American U.S. Pat. No. 5,374, 564) describes a process for manufacturing thin films of a semi conducting material. This document discloses that under some circumstances, the implantation of a rare gas or hydrogen into a substrate made of a semi conducting material can induce the formation of micro-cavities or micro-bubbles (also called platelets) at a depth equal to approximately the average penetration depth of the implanted ions. If the implanted face of this substrate is brought into intimate contact with a stiffener and if a heat treatment is applied at a sufficiently high temperature, then an interaction occurs between the micro-cavities or the micro-bubbles causing separation of the semi conducting substrate into two parts; firstly a thin semi conducting film bonding to the stiffener, and secondly, the remaining part of the semi conducting substrate. Separation takes place in the zone in which micro-bubbles or micro-cavities are present. The heat treatment is such that the interaction between the micro-bubbles or micro-cavities created by implantation can induce a separation between the thin film and the remaining part of the substrate. Therefore, a thin film can be transferred from an initial substrate onto a stiffener used as a support for this thin film.

This process can also be applied to the production of a thin film of a solid material other than a crystalline or not crystalline semi conducting material, or conducting or dielectric material.

The technique disclosed by document FR-A-2 681 472 led to some improvements or developments. Thus, document FR-A-2 748 851 discloses a process that applies a heat treatment of part of the wafer corresponding to the future thin layer, particularly between 400° C. and 900° C. for silicon, without degrading the surface condition of the plane surface of the wafer and without separation of the thin layer, after an ionic implantation step within the range of appropriate doses and before the separation step. This heat treatment may be included as one of the operations for production of electronic components, or it may be imposed for other reasons.

Document FR-A-2 767 416 discloses that the annealing temperature can be lowered if the thermal budget supplied to the substrate during the different steps of the process (ionic implantation step, step bonding the substrate on the stiffener, intermediate treatments if any, annealing step to enable separation), are taken into account. The thermal budget means that, for a step in which heat is input (for example during the annealing step), the temperature is not the only factor, and the time-temperature pair applied to the substrate also needs to be taken into account. In general, the choice of the thermal budget to be used to obtain a fracture depends on the complete set of thermal budgets applied to the basic material or to the structure starting from the implantation step. All these thermal budgets form a thermal balance that help to achieve cleavage of the structure. This thermal balance is usually composed of at least two thermal budgets; for implantation and for annealing.

The improvement suggested in document FR-A-2 773 261 is made possible due to creation of an inclusion or a set of inclusions in the initial substrate material in order to confine the gaseous species added during the ionic implantation step. An inclusion is a volume of material for which the properties are different from the properties of the substrate material from which it is required to transfer a thin film or thin films. The inclusions may be in the form of a layer extending approximately parallel to the surface through which the implantation is done. The shapes that these- volumes may be given are varied and their dimensions may vary from a few tenths of a nanometer to several hundred micrometers. The role of these inclusions is to trap implanted gaseous species. The radius of action of these traps depends on the nature of the inclusions made. The process comprises a preliminary step consisting of forming inclusions in the initial substrate material. A later step consists of implanting gaseous species (rare earths or other) in this material. The presence of inclusions formed in the previous step confines the implanted gaseous species. The efficiency of the inclusions is related to their power of confining gaseous species.

Some processes disclosed in the documents mentioned above enable the production of some or all of components, for example electronic components before separation in the implanted zone and transfer onto a support. In particular, this is the case of document FR-A-2 748 851.

It is also known that a proton implantation can be made with doses of the order of $3.10^{16} H^+/cm^2$ to create a buried insulating layer using the RTA (Rapid Thermal Annealing) heat treatment, or conventional annealing at high temperature. Further information on this subject is given in U.S. Pat. Nos. 5,633,174 and 5,198,371.

For some applications, it seems essential to be able to make substrates comprising a weakened zone. This type of substrate may be called a "removable substrate". Thus, document FR-A-2 748 851 proposes a process for creating a buried fragile zone starting from an implantation of gaseous species, for example such as hydrogen and/or rare gases, introduced alone or in combination. The structure thus obtained (with a surface layer, a buried zone and a substrate) is compatible with partial or complete production of microelectronic, optoelectronic components or components for the micro technologies field. This process avoids the formation of blisters on the surface during heat treatments applied for making electronic components. One means of achieving this is to control the dose of implanted gaseous species. The weakened zone is a preferred separation zone. If constraints are applied judiciously on this zone, separation can take place.

This type of substrate that can be removed after electronic components have been made, may have several advantages for manufacturing of materials, in the field in which thin layers of materials partially or completely containing electronic components are necessary. These thin layers, which also form substrates, may be self supported or may be transferred onto supports that may be flexible, for example such as plastic or rigid supports such as glass, silicon or ceramics. This type of substrate in the form of a thin layer may be used to make photovoltaic components, electronic components and even imagers.

It appears increasingly desirable to have removable substrates, in other words substrates with a thin layer separated from an initial substrate by a weakened zone, compatible with the implementation of technological steps to make components in the thin layer and to which a high temperature can be applied without damaging the condition of the thin layer.

These steps requiring high temperatures may be steps for complete or partial manufacturing of electronic components, if the thin layer is a layer of a semi conducting material.

PRESENTATION OF THE INVENTION

This invention can provide removable substrates that in particular satisfy this requirement.

The purpose of the invention is to make a weakened substrate comprising:
- a step in which at least one gaseous species is introduced into a zone of the substrate in order to form microcavities in this zone, the said thus weakened zone delimiting a thin layer with one face of the substrate and that will be fractured;
- a step in which all or some of the gaseous species in the weakened zone is evacuated.

According to the invention, all or some of the gaseous species is evacuated to avoid a pressure effect in the micro-cavities or micro-cracks which could induce a surface deformation (for example in the form of blisters) or a separation during heat treatments applied to this weakened substrate. The objective of this process is to obtain a substrate weakened at depth that is both compatible with processes for making high temperature components and that enables separation of the thin layer from the remaining part of the substrate.

Advantageously, at least one gaseous species is added by ionic implantation. This implantation may obviously be assisted by diffusion of species, such as thermally activated diffusion or plasma diffusion.

Preferably, the step in which the gaseous species is evacuated comprises a heat treatment carried out so as to enable all or some of the introduced gaseous species to leave the micro-cavities by diffusion. This approach is innovative because heat treatments are usually chosen so as to ensure that the fracture occurs in the implanted zone. According to the invention, these treatments are chosen such that after the implanted zone has been weakened, they cause the evacuation of at least some of the gaseous species with the objective of obtaining a structure compatible with carrying out technological steps later. It may also include application of stresses to the weakened zone. If the substrate is a semi conducting substrate, the heat treatment in the step in which all or some of the gaseous species is evacuated may be a heat treatment applied during production of at least one component in the said thin layer.

According to one variant embodiment, the process also comprises an over-weakening step of the weakened zone. Before the over-weakening step, it may be advantageous to place a stiffening layer, for example a silicon oxide, on the thin layer. This stiffening layer can increase the weakening of the zone while avoiding the formation of blisters. Depending on the components to be made, this layer may be kept or eliminated after the evacuation step. The over-weakening step may comprise a heat treatment applied to the weakened zone before the step in which the gaseous species is evacuated. It may also comprise the application of stresses to the weakened zone. It may also comprise the introduction of at least one gaseous species in the weakened zone. This over-weakening may be done over the entire weakened zone or on some or all of this zone (localized over-weakening).

For example, at least one gaseous species may be introduced into the weakened zone using a method chosen among ionic implantation, thermally activated diffusion and plasma diffusion. The introduction of at least one gaseous species into a zone of the substrate, both for the first step in the process and for an over-weakening step, may be made in a substrate in which at least the part corresponding to the said thin layer is made of silicon, III-V material, SiC, Ge, GaN or a ferro-electric or piezoelectric material for example such as LiNbO$_3$, or sapphire.

If the substrate is a semi conducting substrate, the weakened zone may be over weakened before some or all of at least one component is produced, for example by means of a heat treatment, during manufacturing of all or some of at least one component in the said thin layer, for example by annealing and/or by applying stresses, or for example by adding a gaseous species.

If the substrate is a semi conducting substrate, it may comprise at least one step for manufacturing all or some of at least one component in the said thin layer, after elimination of the gaseous species from the weakened zone. According to one embodiment of the invention, the manufacturing step comprises an epitaxy or heteroepitaxy step.

The process may include a step fixing the said thin layer with a stiffener.

Another purpose of the invention is a process for obtaining a thin layer, characterized in that it firstly applies the process for making the weakened substrate mentioned above, and then applies a step for separation of the thin layer from the remaining part of the substrate. The separation step may be done by the application of a heat treatment and/or the application of mechanical stresses.

Another purpose of the invention is a process for obtaining a semiconductor on insulator type structure, characterized in that it firstly implements the process for making a weakened substrate mentioned above and comprising a step to solidarize the face of the said thin layer with a stiffener, and then implements a step to separate the thin layer from the remaining part of the substrate, the stiffener presenting an insulating face to the said thin layer, the part of the substrate corresponding to the said thin layer being made of a semi conducting material. The part of the substrate corresponding to the said thin layer may be made of silicon, III-V material, SiC, GaN, LiNbO$_3$ or sapphire. The separation step may be done by application of a heat treatment and/or by application of mechanical stresses. According to one embodiment, the process comprises the manufacture of part or all of at least one component, before solidarization with a stiffener.

Finally, another purpose of the invention is a substrate weakened by the presence of a micro-cavities zone, the micro-cavities zone delimiting a thin layer with one face of the substrate, characterized in that gaseous species are completely or partially eliminated from the micro-cavities. The micro-cavities zone may be an over weakened zone. At least part of the substrate corresponding to the said thin layer may be made of silicon, III-V material, SiC, Ge, GaN or a ferro-electric or piezoelectric material.

BRIEF DESCRIPTION OF THE FIGURES

The invention will be understood more clearly and other advantages and specificities will be seen upon reading the following description given as a non-restrictive example, accompanied by the appended figures wherein.

DETAILED DESCRIPTION OF EMBODIMENTS OF THE INVENTION

Figure 1A:
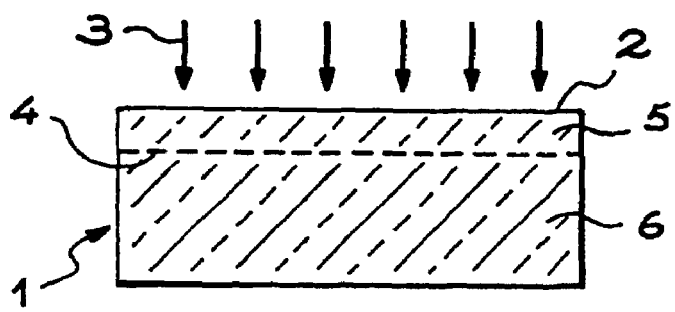
FIGS. 1A to 1D illustrate steps in a process according to the invention for transferring a thin layer of material to a stiffener.

The weakened zone is formed by adding at least one gaseous species using different methods, like those disclosed in documents FR-A-2 681 472, FR-A-2 748 851, FR-A-2 767 416 and FR-A-2 773 261 mentioned above.

These species may be advantageously added by ionic implantation. The gaseous species are preferably chosen from among hydrogen, rare gases or other species that could lead to the presence of cavities or platelets or small micro-cracks. These species may be implanted alone or in combination. They may be added simultaneously or sequentially.

For example, the introduction of gaseous species by implantation is a means of forming cavities located in the cleavage area, in the source substrate. The cavities (or micro-cavities or platelets or micro-bubbles) may be in different forms. They may be spherical and/or flattened with a thickness that can vary from only a few inter-atomic distances to several nanometers. Furthermore, the cavities may contain a free gaseous phase and/or gas atoms derived from the implanted ions, fixed on the atoms of the material forming the walls of cavities.

However, the species introduced must be in a configuration such that they induce the presence of a weakened zone, but without causing the appearance of blisters, particularly on the surface, during the step in which the gaseous species is evacuated and/or the over-weakening step.

In some cases, the step in which gaseous species are introduced may be done locally, for example by masking. It is thus possible to obtain a zone discontinuously weakened in depth. However, if the distance between the weakened zones is not too large, it is possible to obtain a continuous separation over the width of the substrate at the time of the separation. For example, this masking is a means of preventing modifications to the properties of the material by the introduction of gaseous species over the entire surface. It is thus possible to maintain good electrical conductivity of the masked zone.

All or some of the gaseous species are evacuated preferably using heat treatments that enable the species to distribute and quit the cavities. This evacuation of the gaseous species may also be assisted by stresses applied internally or externally to the cleavage area. This evacuation or elimination of gaseous species may possibly be accompanied by a crystalline rearrangement, the main consequence of which will be to modify the morphology of the cavities or platelets. These cavities will either be composed of a vacuum, or may contain a small quantity of gaseous species and will always serve to weaken the material. However, given that these cavities contain no gas or only a small amount of gas, it is easier to carry out all types of technological steps even at high temperature without causing surface deformations or blisters.

The conditions necessary to eliminate all or some of the gaseous species depend on the nature of the gaseous species (hydrogen, helium, in ionized or non-ionized form, in molecular or atomic form, etc.). These conditions also depend on implantation conditions (dose of the species introduced, depth from the surface of the zone containing the cavities, thermal budget input during the step in which the gaseous species are introduced, etc.).

In some cases, and particularly during the production of all or part of a component, technological steps may be advantageously carried out such that they participate in evacuating part of the gaseous species.

Under some conditions, gaseous species may remain after the evacuation step. However, the remaining gaseous species are either bound to the walls of the cavities or micro-cracks, or their quantities are too small to induce surface deformations.

Preferably, it is useful to increase weakening at the cleavage area. Thus, an over-weakening step may be made. The over-weakening step is done by the application of heat treatment steps and/or stresses at the weakened zone. These steps may be carried out alone or in combination successively or simultaneously.

The over-weakening step may comprise one or several steps to introduce a gas or gaseous species like that defined in the initial step in which gaseous species are introduced, applied alone or in combination. These steps to introduce gaseous species may be alternated with one or several heat treatment and/or stress application steps as defined above.

The purpose of this over-weakening step is to facilitate the step that consists of effectively separating the thin layer from the remaining part of the substrate. Advantageously, this over-weakening step may be carried out so as to enable cavities to develop and to form larger cavities or micro-cracks and therefore to over-weaken the material.

The over-weakening step may advantageously be carried out by varying heat treatment parameters, and particularly by controlling thermal budgets. For example, a heat treatment can be carried out associated with a dose that weakens by creating micro-cracks in the buried zone. However, these micro-cracks are such that they do not induce any surface deformations. This result can be obtained in two advantageous manners: either the implantation is made at a relatively high energy, for example 200 keV, or the implantation is made at a lower energy and a stiffener, for example silicon oxide, is deposited after the implantation. For example, over-weakening may be achieved by the development of relatively large cavities that can be assimilated with micro-cracks. For example, one way of doing this is to create limiting implanted hydrogen dose conditions ($6 \times 10^{16}$ $H^+/cm^2$ at 210 keV) which can give a fracture at high temperature, for example at about 650° C. in a few minutes, but not at low temperature (500° C.). It has been shown that in general, if a fracture is to be obtained by heat treatment, it is important to take account of the treatment temperature and the time; we then talk about the thermal budget (see document FR-A-2 767 416). However, under some limiting conditions, the fracture cannot be obtained below some temperatures. The result is then that micro-cracks are formed, for example by interaction between smaller cavities, by the effect of pressure in the cavities and/or by the presence of external or internal stresses and/or by the effect of introducing gaseous species towards cavities, for example by diffusion. The heat treatment may for example be carried out for a few minutes at 600° C. This type of treatment can increase the size of cavities or micro-cracks and over-weaken the material. However, if another heat treatment is to be carried out after this treatment at a higher temperature, there is a risk of damage to the surface (formation of "blisters", etc.). Note that a treatment that modifies the stress may lead to the same result.

As described in the invention, it is advantageous to do the annealing at a lower temperature, for example 500° C., for several hours in order to evacuate all or some of the hydrogen present in the cavities. Thus, micro-cracks or large cavities are created, and all or some of the gas contained in these cavities or micro-cracks has been evacuated. Thus, the over weakened structure can be annealed at high temperature without any danger for the thin layer. The shape of cavities may change during this over-weakening step.

In one variant of the process, this over-weakening step may be carried out with conditions under which gaseous species are introduced that lead to the presence of "blisters", for example if annealing is done at 500° C. In this case, the heat treatment conditions and/or the presence of stresses have to be adapted so as to weaken the material without inducing the presence of "blisters" on the surface. This is done by using very long annealing times at low temperature in order to enable cavities to enlarge.

In another variant, substrates can be over weakened with conditions for introducing gaseous species that make the presence of "blisters" after implantation, and separation by heat treatment, impossible.

In general, over-weakening conditions must be adapted to the conditions under which gaseous species are introduced. For example, in the case of an ionic implantation, it is obviously necessary to take account of the dose of implanted species and also the implantation energy and the implantation temperature. It is also essential to take account of stresses present in the weakened zone during the over-weakening step. These stresses may be applied to the structure internally or externally. For example, they may be tension forces, shear forces, bending forces or peeling forces, applied alone or in combination.

Advantageously, it is possible to perform all or some of a process to make a microelectronic, opto-electronic component or even a micro-system, between the over-weakening step and the separation step. It is even possible to introduce steps for deposition, annealing, or epitaxial material growth in a liquid phase or gaseous phase. For example, these steps may be used to adapt the thickness of the thin layer. For example, an epitaxy of about 5 µm of silicon can be done to make CMOS type components, while a 50 µm epitaxy may be done for photovoltaic type components.

In some cases, this over-weakening step may even be obtained by some or all of the steps to create the component(s) if these steps are carried out judiciously. The advantage of this process is that it is compatible with steps to make components at high temperature, for example such as 1100° C., considering the fact that the pressure in the cavities is very much reduced during the step to evacuate all or some of the gaseous species.

After the step to make some or all of the components has been completed, it is possible to carry out an over-weakening or a weakening step by another step in which gas is introduced, for example by implantation of rare gas and/or hydrogen and/or thermally activated diffusion and/or plasma diffusion. These species may be introduced over the entire surface of the substrate or in a masked manner by protecting some zones, or in a localized manner by making preferred introduction paths, for example such as trenches, the depth of which may reach or exceed the weakened or over weakened zone. In this case, gaseous species are introduced laterally. Advantageously, this introduction may be controlled by diffusion. This step may be completed by heat treatment and/or mechanical stress application steps. These additional steps increase over-weakening and may facilitate the separation step. Thus, stresses to be applied to obtain separation may be minimized or even eliminated.

If chips are cut out from a substrate, it is possible to do the over-weakening after cutting out by introducing a gas through the edges of the chip or even to make a local overdose.

The separation step may be carried out by different means which may be mechanical means combined or not combined with thermal means, or vice versa. These separation means may be applied in pulses or continuously. Separation means based on gaseous or liquid fluid may also be used. Some examples of mechanical separation are the use of tension, bending, shear or peeling forces, and these forces may be applied externally or may be partly induced by stresses internal to the structure. External forces may be applied either directly or by intermediate means such as a flexible support, or a rigid support.

Thus, after separation, the thin layer obtained may be self supported or it may be on a support. In some cases, the use of a support will facilitate manipulation of the thin layer that may contain electronic components. It may be advantageous to solidarize the substrate, possibly over weakened, onto a stiffener, before separation but after the step to eliminate all or some of the gaseous species. This solidarization may be done by means capable of applying very high forces or means of obtaining controlled bonding forces, and particularly compatible with a subsequent separation at this interface. For example, molecular bonding or glue may be used.

After separation and after obtaining the thin layer, the remaining part of the substrate may be recycled either as an initial substrate or as a support.

FIGS. 1A to 1D illustrate an example embodiment of the invention. These are cross-sectional views.

FIG. 1A shows a silicon substrate 1 during the step in which a gaseous species is introduced. In order to achieve this, the face 2 of this substrate is subjected to ionic implantation symbolized by the arrows 3. For a silicon substrate, hydrogen can be implanted for an energy of 200 keV and for a dose of the order of $6 \times 10^{16}$ H$^+$/cm$^2$. The layer 4 of micro-cavities is then formed making up a weakened zone. The layer 4 of micro-cavities or the weakened zone separates the substrate 1 into two parts; a thin layer 5 located between the implanted face 2 and the weakened zone 4, and the remaining part 6 of the substrate located under the weakened zone 4.

For example, a heat treatment may be applied at a temperature of 600° C. for 15 minutes to over-weaken the substrate 1 at the layer 4 of micro-cavities that become larger cavities or even micro-cracks.

Figure 1B:
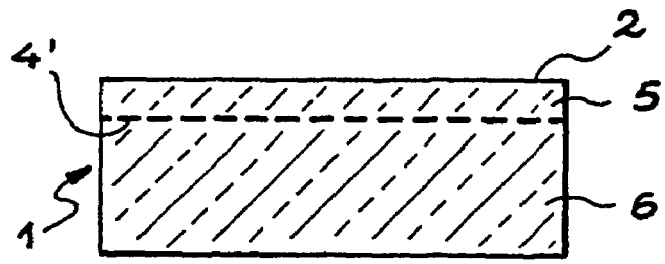

The step in which all or some of the hydrogen present in the micro-cavities is evacuated is done by annealing the substrate 1 to 500° C. for several hours, for example for 10 hours. FIG. 1B represents the substrate 1 at the end of this step. The over weakened zone 4' corresponds to the layer 4 of micro-cavities but the gas that had been contained in these micro-cavities is now completely or partially evacuated.

Different technological operations requiring a high temperature can then be performed. For example, the thickness of the thin layer 5 may be increased by gaseous phase epitaxy.

Figure 1C:
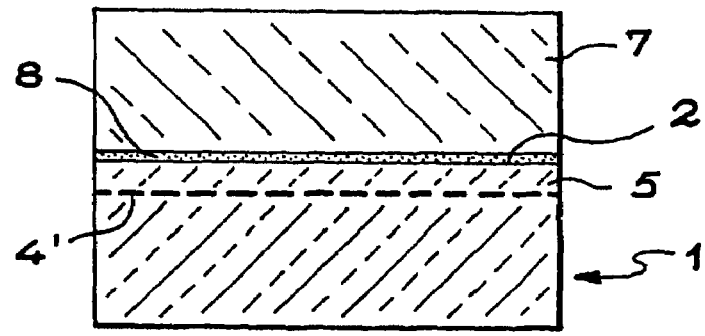

FIG. 1C illustrates a step in which face 2 of the substrate 1 is solidarized on a support substrate 7 or stiffener. Solidarization may be achieved by different means; for example by an adhesive substance or by molecular bonding. A glue layer 8 may also be used. Since the substrate 1 is made of silicon, an oxide layer may be formed on face 2 of the substrate 1. If the stiffener 7 also has a silicon oxide layer, bringing the two oxide layers into contact then forms the glue layer.

Figure 1D:
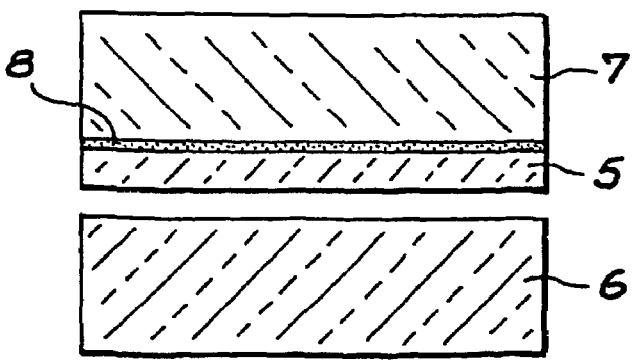

FIG. 1D illustrates a step for separation of the thin layer 5 of the remaining part 6 of the substrate along the weakened zone. A silicon on insulator (SOI) type structure can thus be obtained.

FIGS. 2A to 2I illustrate another example embodiment of the invention. These are also cross-sectional views.

Figure 2A:
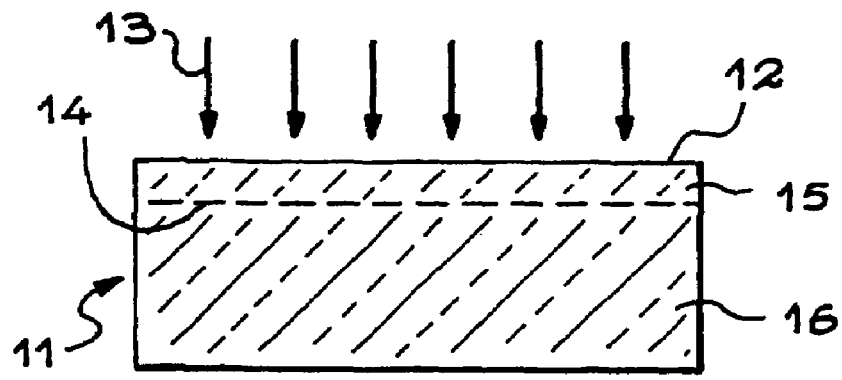
FIGS. 2A to 2I illustrate steps in a process according to the invention for transferring a thin layer of a material comprising components onto a stiffener and to selectively transfer these components onto reception supports.

FIG. 2A illustrates the step in which a gaseous species is introduced as above by ionic implantation. The face 12 of a semi conducting substrate 11, for example made of silicon, is subjected to ionic implantation 13 which creates a layer of micro-cavities 14. An over-weakening step may then be carried out.

Figure 2B:
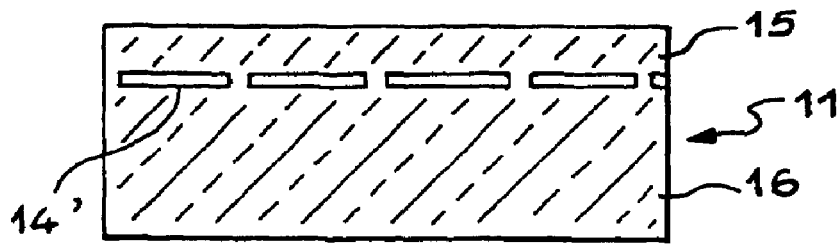

As before, the next step is to eliminate the gaseous species. The result obtained is shown in FIG. 2B, in which reference 14' corresponds to the over weakened layer of micro-cavities, and the gas contained in them has been partially or completely evacuated.

Figure 2C:
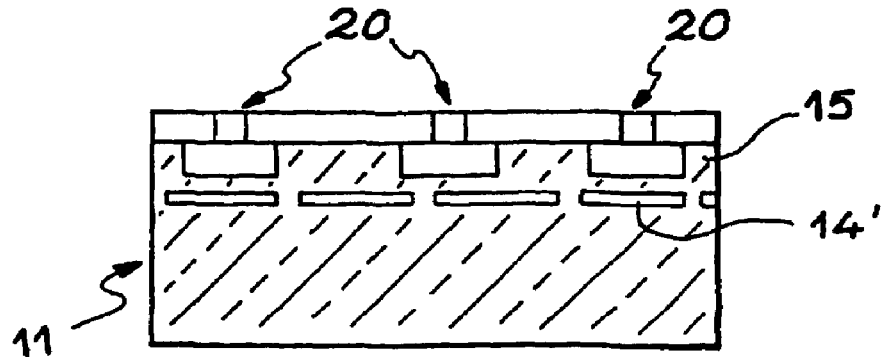
Figure 2:
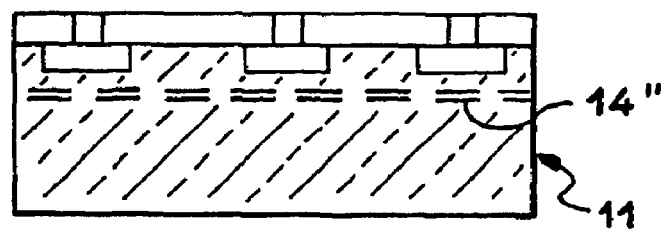
Figure 2:
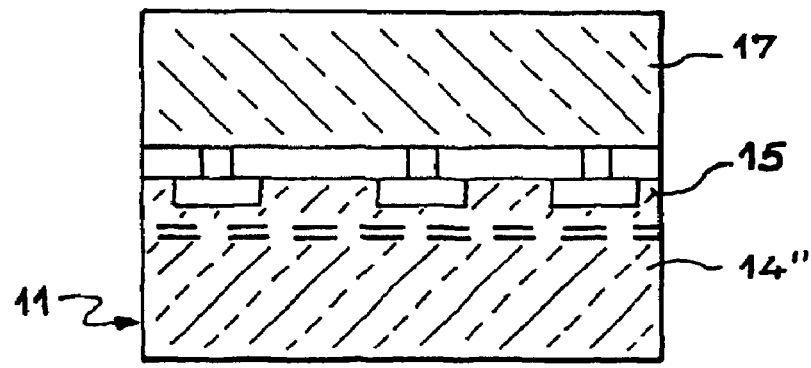
Figure 2:
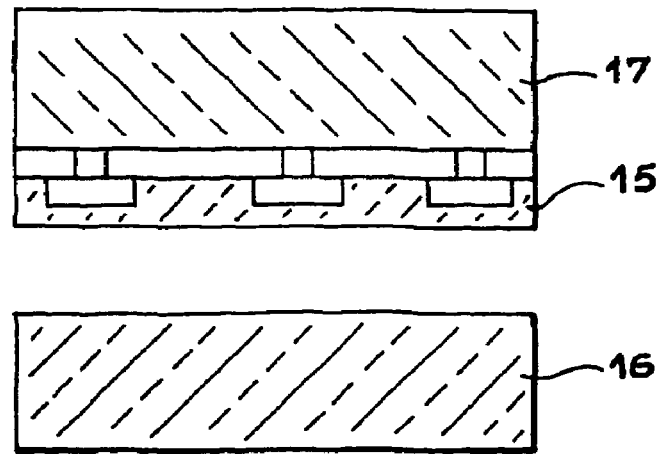
Figure 2:
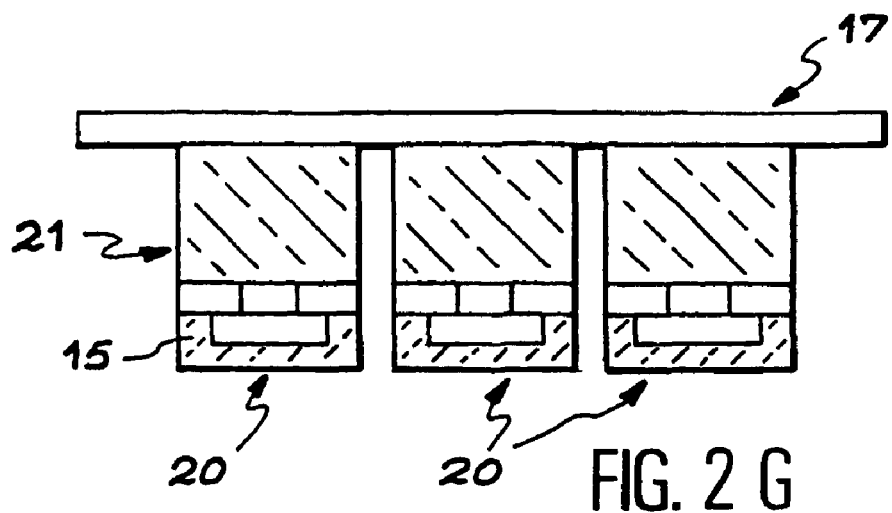
Figure 2:
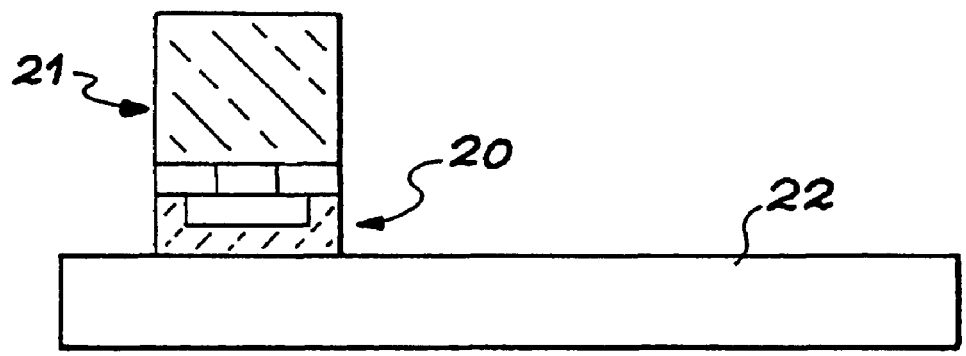
Figure 2:
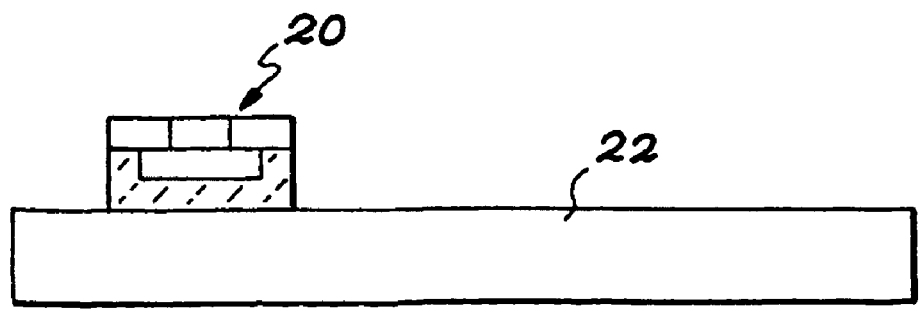

FIG. 2C shows the substrate 11, in which the thin layer 15 has been subjected to a number of technological operations (epitaxy, heat treatments, depositions, implantation of doping agents, etc.), in order to make electronic components 20 in this thin layer.

FIG. 2D shows the substrate 11 on which an additional step has been carried out to introduce gaseous species. The weakened zone is marked with reference 14".

FIG. 2E illustrates solidarization of the substrate 11 on a support substrate 17, also called a stiffener or handle. If the thin layer 15 has a specific topology, it may be made plane before bonding.

Bonding forces between the two substrates 11 and 17 may be controlled so as to control the bond forces such that they are strong enough to enable separation at the weakened zone, and such that these forces are sufficiently low to enable separation later at the bond interface. These bonding forces may be controlled by varying cleaning and therefore the hydrophilic nature of the surfaces, but also on the roughness or the percentage of bonded surfaces.

The stiffener can also be solidarized by means of an adhesive that may enable reversible bonding under the effect of heat treatments and/or ultraviolet type treatments.

FIG. 2F illustrates the step for separation of the thin layer 15 bonding to the handle 17 of the remaining part 16 of the substrate along the weakened zone.

The handle may then be broken down into elements corresponding to electronic components and which can be transferred onto different supports. These supports may be made of plastic like on a smart card or in this case glue may advantageously be used for the transfer. The elements may also be transferred onto a plate comprising other electronic or optoelectronic devices, and in this case the transfer may make use of a molecular bonding technique. Elements may be transferred by conventional means such as "pick and place" means. By applying a stress later on, the thin layer glued on its final support may be separated from its handle by mechanical forces. According to another example application, these supports may be made of glass or a transparent substrate, particularly to make imagers.

FIG. 2G shows the breakdown of the handle 17 supporting the thin layer 15, into elements 21. However, the elements 21 are still attached to the handle 17.

FIG. 2H shows an element 21 transferred onto its final support 22.

FIG. 2I shows the result obtained after elimination of the part of the handle remaining in the transferred element. The final support 22 supports a component 20.

The invention may be applied to the manufacture of solar cells. In this case, the objective is to make a self-supported monocrystalline silicon membrane. This is done by adding gaseous species into the monocrystalline silicon, for example by ionic implantation. Implantation conditions equal to $5.5\times 10^{16}$ $H^+/cm^2$ at 210 keV may be used, but the over-weakening conditions may also be modified. Over-weakening heat treatments may be used, as before, in order to develop the cavities and so as to weaken the substrate material. In this case, the heat treatment may be done at 650° C. for 1 minute. The gaseous species present in the micro-cavities is then totally or partially eliminated by a heat treatment carried out at 500° C. for 12 hours. An epitaxy can increase the thickness of the thin layer to the required value, for example a liquid phase epitaxy at about 900° C. with a growth rate of the order of 1 μm/min. With an epitaxy, the doping of the material in the thin layer can be varied. Technological steps can then be carried out on the front face of the thin layer, for example to make an anti-reflection layer or a ground plane or controlled doping zones. The thin layer is then separated from its substrate. For example, mechanical forces may be applied or a gaseous fluid may be introduced at the interface. This membrane may then be transferred onto a large glass sheet. Paving can be made using round or square plates in order to obtain a completely covered surface, and to form a large glass area covered with monocrystalline silicon. The transfer may be made by using products forming the adhesive or by the use of molecular bonding. The next step is to continue the technology on its large glass surfaces to complete the cell. With this type of paving, a technological step can be performed collectively.

In one variant of the process, the implantation dose may be reduced to $6\times 10^{16}$ $H^+/cm^2$ for an energy of 200 keV. The next step is epitaxy of 50 μm of silicon at 950° C. for 50 minutes. Temperature increases are judiciously chosen to enable evacuation of gaseous species. For example, the temperature may be increased from ambient temperature to 500° C. at a rate of 80° C./min. and then held at 500° C. for 1 hour, and then increased to 950° C. at a rate of 80° C./min. During the epitaxy, the gaseous species leave the cavities, or even leave the material, leaving completely or partially empty cavities that still weaken the material. In this particular case, the elimination step includes the epitaxy step. These cavities are present at the implanted zone. All that is necessary to make a separation at the weakened zone is to apply mechanical forces on the structure, for example tension and/or peeling and/or shear and/or bending forces.

In another variant of the process, the implantation may be achieved at 100 keV for a dose of the order of $5\times 10^{16}$ $H^+/cm^2$. A stiffener is then deposited to avoid the formation of "blisters" during the heat treatment. This stiffener may be made by a deposition of 5 μm of silicon oxide. An over-weakening annealing is then done; for example at 550° C. for 5 minutes, followed by evacuation annealing at 500° C. for about 12 hours. Note that the annealing time necessary to increase the size of cavities may be reduced if the stiffener deposit induces a high stress at the implanted zone.

According to another variant, the weakened zone is obtained by co-implantation of hydrogen and helium. Note that the implantation order may induce slight changes in the weakening conditions and that with co-implantation, the total dose of implanted species can be reduced. For example, co-implantation may consist of implanting $10^{16}$ hydrogen atoms/$cm^2$ at 76 keV and $10^{16}$ helium atoms/$cm^2$ at 120 keV.

In some cases, the over-weakening and elimination heat treatments may be done simultaneously during the same heat treatment, which may be at a determined temperature, for example 530° C.

This invention is generic and is applicable to different materials and different applications. For example, there is the case of an SiC material on which a GaN epitaxy is done and that is separated after epitaxy to obtain a self-supported structure. For example, an ionic implantation may be done at 150 keV of hydrogen for a dose of $6\times 10^{16}$ $H^+/cm^2$. The cavities are enlarged to obtain micro-cracks by means of a heat treatment, for example at 950° C. for 5 min. Note that SiC is efficiently rigid and does not lead to the formation of blisters. A heat treatment is then carried out at 800° C. for 12 hours to reduce the pressure in the cavities by eliminating gas. A GaN epitaxy is then done at 1050° C., starting from which a thin layer can be made with its component or a thick layer. Separation is then achieved, for example using mechanical means to obtain a self-supported structure or a thin film layer transferred onto a support.

The invention claimed is:

1. A process for making a removable substrate comprising:
   introducing a gaseous species into a zone of the substrate to form micro-cavities in the zone, the zone thereby being weakened and delimiting a thin layer with one face of the substrate;
   heat-treating, after said introducing, the zone of the substrate during a given time to thereby evacuate the gaseous species from the micro-cavities without causing a separation in the substrate because a temperature of the heat treating and the given time being such that a separation of the thin layer from a remaining part of the substrate does not occur during the heat-treating; and
   performing, after said heat-treating, a technological step requiring a high temperature.

2. Process according to claim 1, wherein the introducing of the at least one gaseous species includes ionic implantation.

3. Process according to claim 1, wherein the heat-treating allows at least some of the gaseous species added to leave the micro-cavities by diffusion.

4. Processing according to claim 3, wherein the heat-treating includes application of stresses to the weakened zone.

5. Process according to claim 3, wherein the substrate is a semiconductor substrate, and the heat-treating is applied during manufacture of at least one component in the thin layer.

6. Process according to 1, further comprising over-weakening of the weakened zone.

7. Processing according to claim 6, further comprising depositing a stiffening layer on the thin layer, before the over-weakening.

8. Process according to claim 6, wherein the over-weakening includes a heat treatment applied to the weakened zone before the evacuating.

9. Process according to claim 6, wherein the over-weakening includes applying stresses in the weakened zone.

10. Process according to claim 6, wherein the over-weakening includes introducing of at least one further gaseous species in the weakened zone.

11. Process according to claim 10, wherein the at least one further gaseous species is introduced into the weakened zone using a method chosen from among ionic implantation, thermally activated diffusion, and plasma diffusion.

12. Process according to claim 6, wherein the over-weakening induces localized over-weakening of the weakened zone.

13. Process according to claim 6, wherein the substrate is a semiconductor substrate, and the over-weakening of the weakened one is done during manufacture of at least part of at least one component in the thin layer.

14. Process according to claim 1, wherein the substrate is a semiconductor substrate, and further comprising manufacturing at least one part of at least one component in the thin layer, after the gaseous species has been evacuated from the weakened zone.

15. Process according to claim 14, wherein the manufacturing comprises an epitaxy or heteroepitaxy.

16. Process according to claim 14, wherein after the at least one part of the at least one component has been made, the process further comprises introducing a further gaseous species.

17. Process according to claim 1, further comprising solidarization of a face of the thin layer with a stiffener.

18. Process according to claim 1, wherein the introducing of the at least one gaseous species into a substrate zone is done in a substrate in which at least a part corresponding to the thin layer is made of silicon, III-V material, SiC, Ge, GaN or a ferroelectric or piezoelectric material, or sapphire.

19. Process to obtain a thin layer, implementing the process for making a removable substrate according to claim 1, and then separating the thin layer from a remaining part of the substrate.

20. Process for obtaining a thin layer according to claim 19, wherein the separating includes at least one of applying a second heat treatment and applying mechanical stresses.

21. Process for obtaining a semiconductor on insulator type structure, implementing the process for making a removable substrate according to claim 17, and then separating the thin layer from a remaining part of the substrate, the stiffener presenting an insulating face to the thin layer, a part of the substrate corresponding to the thin layer being made of a semiconducting material.

22. Process for obtaining a semiconductor on insulator type structure according to claim 21, wherein the part of the substrate corresponding to the thin layer is made of silicon, or a III-V material, or SiC.

23. Process for obtaining a semiconductor on insulator type structure according to claim 21, wherein the separating includes at least one of applying a second heat treatment and applying mechanical stresses.

24. A process for making a thin layer comprising:
introducing a gaseous species into a zone of the substrate to form micro-cavities in the zone, the zone thereby being weakened and delimiting a thin layer with one face of the substrate;
first heat-treating, after said introducing, the zone of the substrate during a given time to thereby evacuate the gaseous species from the micro-cavities without causing a separation in the substrate because a temperature of the first heat treating and the given time being such that a separation of the thin layer from a remaining part of the substrate does not occur during the first heat-treating;
second heat-treating used for technological processing, after said first heat-treating; and
separating, after said second heat-treating, the thin layer from the remaining part of the substrate.

25. The process according to claim 24, wherein the second heat-treating is configured to make at least one of an anti-reflection layer, a ground plane or a controlled doping zone.

26. The process according to claim 24, wherein the second heat-treating is an epitaxy growth process.

27. The process according to claim 1, wherein the heat-treating is further configured to evacuate the gaseous species in the weakened zone, so as to allow at least one of an epitaxy process or heteroepitaxy process after the heat treating.

28. The process according to claim 6, wherein conditions of introduction of the gaseous species are such that, in an absence of evacuating the gaseous species from the micro-cavities, annealing the cavities at 500° C. would lead to blisters.

29. The process according to claim 6, wherein conditions of introduction of the gaseous species are limit implantation dose conditions which give a fracture at a high temperature.

* * * * *